(12) United States Patent
Tetsuji et al.

(10) Patent No.: US 7,307,046 B2
(45) Date of Patent: Dec. 11, 2007

(54) COMPOSITION FOR THICK OXIDE SUPERCONDUCTOR FILM AND METHOD OF PRODUCING OXIDE SUPERCONDUCTOR IN FORM OF THICK FILM TAPE USING THE SAME

(75) Inventors: Honjo Tetsuji, Tokyo (JP); Tokunaga Yoshitaka, Tokyo (JP); Izumi Teruo, Tokyo (JP); Shiohara Yuh, Tokyo (JP); Goto Tomotaka, Tokyo (JP); Yoshinaka Atsuya, Tokyo (JP); Yajima Akimasa, Tokyo (JP)

(73) Assignees: International Superconductivity Technology Center, The Juridical Foundation (JP); Adeka Corporation (JP); SWCC Showa Cable Systems Co., Ltd. (JP)

( * ) Notice: Subject to any disclaimer, the term of this patent is extended or adjusted under 35 U.S.C. 154(b) by 292 days.

(21) Appl. No.: 10/531,172

(22) PCT Filed: Nov. 7, 2003

(86) PCT No.: PCT/JP03/14178

§ 371 (c)(1),
(2), (4) Date: Apr. 11, 2005

(87) PCT Pub. No.: WO2004/044929

PCT Pub. Date: May 27, 2004

(65) Prior Publication Data

US 2006/0043347 A1    Mar. 2, 2006

(30) Foreign Application Priority Data

Nov. 8, 2002    (JP)    ............... 2002-325812

(51) Int. Cl.
*H01B 12/00* (2006.01)
*B05D 5/12* (2006.01)

(52) U.S. Cl. .............. 505/445; 505/471; 505/734; 427/62

(58) Field of Classification Search ............... 505/125, 505/445, 471, 734; 427/62
See application file for complete search history.

(56) References Cited

U.S. PATENT DOCUMENTS 4,918,051 A * 4/1990 Mantese et al. ............ 505/446
5,122,510 A * 6/1992 Chen et al. ................. 505/430

FOREIGN PATENT DOCUMENTS

| JP | 01-111713 | * | 4/1989 |
| JP | 01-111713 A | | 4/1989 |
| JP | 01-157408 | | 6/1989 |
| JP | 2002-075079 | * | 3/2002 |
| JP | 2002023439 | | 7/2002 |

OTHER PUBLICATIONS

"Solution Processing of YBa2Cu3O7-x thin films . . . ", Mater. Res. Soc. Symp. Proc. 1998(495), 203-208.*

* cited by examiner

*Primary Examiner*—Mark Kopec
(74) *Attorney, Agent, or Firm*—Bacon & Thomas, PLLC

(57) ABSTRACT

To provide a composition for a thick oxide superconducting film containing a copper salt of a branched saturated aliphatic carboxylic acid having 6 or more carbon atoms and/or a copper salt of an alicyclic carboxylic acid having 6 or more carbon atoms, which is suitable for producing thick copper based oxide superconducting films by the MOD process and which can be subjected to film formation with uniformity at a high speed, and an oxide superconductor in the form of a thick film tape which is subjected to film formation with uniformity at a high speed using the subject composition for a thick oxide superconducting film.

22 Claims, No Drawings

COMPOSITION FOR THICK OXIDE SUPERCONDUCTOR FILM AND METHOD OF PRODUCING OXIDE SUPERCONDUCTOR IN FORM OF THICK FILM TAPE USING THE SAME

CROSS-REFERENCE TO RELATED APPLICATIONS

This application is a National Phase Application (35 USC 371) of PCT/JP2003/014178 and claims priority of Japanese Application No. 2002-325812 filed Nov. 8, 2002.

TECHNICAL FIELD

The present invention relates to a composition for a thick oxide superconducting film by the metal organic deposition process (hereinafter sometimes referred to as "MOD process") for forming a ceramic on a substrate by heating and/or baking a precursor and to an oxide superconductor in the form of a thick film tape using the subject composition, and in particular, it relates to a composition for a thick oxide superconducting film which can be subjected to film formation with uniformity at a high speed and to an oxide superconductor in the form of a thick film tape which is subjected to film formation with uniformity at a high speed.

BACKGROUND ART

In oxide superconductors, since the critical temperature ($T_c$) thereof exceeds the temperature of liquid nitrogen, their applications to wires, devices, etc. are expected, and various studies have been vigorously made.

In particular, in order to apply oxide superconductors to wires, it is necessary to produce oxide superconductors having a high critical current density ($J_c$) and a long length. On the other hand, in order to obtain long oxide superconductors in the form of a tape, it is necessary to form an oxide superconductor on a metal tape from the viewpoints of strength and flexibility.

Also, since oxide superconductors have anisotropy in the crystallography, in order to improve the $J_c$, it is necessary to establish a film formation process for epitaxially growing an oxide superconductor on an aligned substrate.

As processes for producing a tape-formed RE based oxide superconductor, i.e., $RE_{1+x}Ba_{2-x}Cu_3O_y$ (wherein RE represents at least one element selected from the group consisting of Y, Nd, Sm, Gd, Eu, Yb, Pr and Ho; x represents the number of $0 \leq x \leq 0.4$; and y represents the number of $6.5 \leq y \leq 7.0$, hereinafter the same) based oxide superconductor, there is known the MOD process.

This MOD process (Metal Organic Deposition process) is to thermally decompose organic acid metal salts and is a process for coating a solution having a metal component-containing organic compound uniformly dissolved therein on a substrate and then heating it for thermal decomposition, thereby forming a thick film on the substrate. The MOD process has such an advantage that since not only a high $J_c$ is obtained in a non-vacuum process, but also high-speed film formation can be achieved at low costs, this process is suitable for the production of oxide superconducting wires in the form of a tape.

In the MOD process, when a starting material containing metal organic acid salts is thermally decomposed, a carbonate of an alkaline earth metal (such as Ba) is usually formed. In the formation of an oxide superconductor by a solid phase reaction via such a carbonate, a high-temperature heat treatment at 800° C. or higher is necessary. Also, a lowering of the $J_c$ caused due to film thickening becomes a serious problem.

Against the foregoing problems, in recent years, there have been vigorously carried out processes for forming an RE (123) superconductor (RE:Ba:Cu=1:2:3, hereinafter the same) using fluorine-containing organic acid salts (for example, a TFA salt: trifluoroacetic acid salt) as the starting material by a heat treatment in a water vapor atmosphere while controlling a water vapor partial pressure (for example, see Patent Document 1). According to the process using this TFA salt as the starting material, it is possible to epitaxially grow the RE (123) superconductor from a substrate by reaction of water vapor and a fluorine-containing amorphous precursor. Concretely, after coating the starting material solution on the substrate, the coated substrate is thermally treated for crystallization at 750° C. via a calcination step for thermally treating it at not higher than 400° C. for the purpose of decomposing organic components, thereby forming a superconducting film. As characteristics of the heat treatment in the present process, there is enumerated the generation of an HF gas by reaction of fluorine and water vapor in the film. In particular, in the calcination step, a large amount of HF gas is generated due to the decomposition of copper trifluoroacetate into CuO. For this reason, in order to prevent cracking, etc. in the film due to abrupt decomposition reaction from occurring, it is necessary to control the heating rate in the calcination step at not more than 1° C./min. Also, taking into consideration the solubility of the TFA salt, highly volatile methanol must be chosen as a solvent. Accordingly, a change of the starting material solution with time is vigorous even at room temperature, and its viscosity becomes higher with an increase of the concentration.

In the light of the above, since the trifluoroacetic acid metal salt is soluble in only a low boiling solvent such as methanol, the solvent is vaporized during the coating work of the starting material solution on the substrate so that uniform coating cannot be achieved. Thus, the uniformity of the resulting thick oxide superconducting film was low. Also, since it takes a long period of time for the calcination step prior to the actual baking, the high-speed film formation was difficult.

Accordingly, an object of the present invention is to provide a composition for a thick oxide superconducting film capable of being subjected to film formation with uniformity at a high speed, which is suitable for producing thick copper based oxide superconducting films by the MOD process, and an oxide superconductor in the form of a thick film tape which is subjected to film formation with uniformity at a high speed using the subject composition for a thick oxide superconducting film.

[Patent Document 1] U.S. Pat. No. 5,231,074

DISCLOSURE OF THE INVENTION

The present inventors have found that by using a copper salt of a branched saturated aliphatic carboxylic acid having 6 or more carbon atoms and/or a copper salt of an alicyclic carboxylic acid having 6 or more carbon atoms in place of the conventionally used copper trifluoroacetate, it is possible to set up the heating rate in the calcination step at 2° C./min or more.

The invention has been made based on the foregoing finding and is to provide a composition for a thick oxide superconducting film, containing a copper salt of a branched saturated aliphatic carboxylic acid having 6 or more carbon atoms and/or a copper salt of an alicyclic carboxylic acid having 6 or more carbon atoms.

Also, the invention is to provide the foregoing composition for a thick oxide superconducting film containing an organic solvent having a boiling point of 80° C. or higher as a solvent. By using the organic solvent having a boiling point of 80° C. or higher, which is low in vapor pressure at room temperature, as a solvent, it is possible to prepare an oxide superconductor in the form of a thick film tape having a uniform thickness, which is small in a change of its concentration even when it is allowed to stand for a long period of time in the air.

Also, the invention is to provide an oxide superconductor in the form of a thick film tape, subjecting an oxide superconducting precursor, which is obtained by coating the foregoing composition for a thick oxide superconducting film on a substrate and then subjecting it to a heat treatment for calcination, to a heat treatment for crystallization, thereby forming a thick oxide superconducting film on the foregoing substrate.

The invention will be described below in detail.

The composition for a thick oxide superconducting film of the invention can be well soluble in an organic solvent having a relatively high boiling point even without using a low boiling solvent which has hitherto been used in compositions of such a type and contains a copper salt of a branched saturated aliphatic carboxylic acid having 6 or more carbon atoms and/or a copper salt of an alicyclic carboxylic acid having 6 or more carbon atoms as an essential component.

Not only such a copper salt per se is readily soluble in an organic solvent having a relatively high boiling point, but also it has such an effect that it is able to make other components than the copper salt soluble in the organic solvent having a relatively high boiling point.

The branched saturated aliphatic carboxylic acid and/or the alicyclic carboxylic acid which constitutes the copper salt has 6 or more carbon atoms, and preferably 8 or more carbon atoms. When the number of carbon atoms is too small, it is difficult to obtain the effect for making other components than the copper salt soluble in the high boiling solvent.

The upper limit of the number of carbon atoms of such a carboxylic acid is not particularly limited. However, when the number of carbon atoms is extremely large, the copper salt per se becomes hardly soluble in the solvent, and therefore, the number of carbon atoms is preferably not more than 16, and more preferably not more than 12.

The copper salt of a branched saturated aliphatic carboxylic acid having 6 or more carbon atoms and/or the copper salt of an alicyclic carboxylic acid having 6 or more carbon atoms is most preferably at least kind selected from the group consisting of copper neodecanoate, copper isononanoate, copper 2-ethylhexanoate, and copper naphthenate.

The composition for a thick oxide superconducting film of the invention is a copper based composition for a thick oxide superconducting film containing the foregoing specific copper salt as a copper precursor compound and can arbitrarily contain conventionally known compounds as precursor compounds other than copper. The content of the foregoing copper salt in the composition for a thick oxide superconducting film of the invention is preferably from 10 to 60% by weight, and especially preferably from 20 to 45% by weight.

For example, in the case of a Y—Ba—Cu based composition for a thick oxide superconducting film, the composition for a thick oxide superconducting film of the invention can contain an yttrium precursor compound and a barium precursor compound along with the foregoing copper salt.

The foregoing yttrium precursor compound is not particularly limited, and known yttrium precursor compounds can be used. However, yttrium trifluoroacetate is preferable from the viewpoint of film forming properties.

Also, as the foregoing yttrium precursor compound, yttrium salts of a branched saturated aliphatic carboxylic acid having 6 or more carbon atoms and yttrium salts of an alicyclic carboxylic acid having 6 or more carbon atoms are preferable. The branched saturated aliphatic carboxylic acid having 6 or more carbon atoms and the alicyclic carboxylic acid having 6 or more carbon atoms, each of which constitutes such an yttrium salt, are the same as those constituting the foregoing copper salt.

The foregoing barium precursor compound is not particularly limited, and known barium precursor compounds can be used. However, barium trifluoroacetate is preferable from the viewpoint of film forming properties.

In the composition for a thick oxide superconducting film of the invention, the content of the foregoing copper salt as the yttrium precursor compound, the barium precursor compound, and the copper precursor compound is not particularly limited, and the ratio of the respective metal components may be the same as in conventionally known compositions for a thick oxide superconducting film. For example, an yttrium/barium/copper molar ratio is preferably 1/(1.8 to 2.2)/(2.4 to 3.6).

It is preferable that the composition for a thick oxide superconducting film of the invention contains an organic solvent which dissolves these precursor compounds therein as the solvent. The subject organic solvent is not particularly limited so far as it dissolves these precursor compounds therein. Examples thereof include 2-octanone, 3-pentanone, 3-heptanone, 4-heptanone, 4-methyl-2-pentanone, 2,6-dimethyl-4-heptanone, and 1-pentanol. Of these organic solvents, organic solvents having a boiling point of 80° C. or higher are preferable; and 2-octanone is especially preferable.

When a low boiling solvent is used, in producing an oxide superconductor in the form of a thick film tape as described later using the composition for a thick oxide superconducting film, the low boiling solvent is vaporized in a step for coating the composition for a thick oxide superconducting film on a substrate, whereby the concentration of the composition for a thick oxide superconducting film is changed (concentrated), and therefore, it likely becomes difficult to achieve uniform coating. However, by using an organic solvent having a boiling point of 80° C. or higher as the solvent, it becomes possible to achieve uniform coating.

The content of the foregoing organic solvent in the composition for a thick oxide superconducting film of the invention is preferably from 25 to 80% by weight, and especially preferably from 35 to 60% by weight.

The composition for a thick oxide superconducting film of the invention may further contain arbitrary components such as a thickener, a stabilizer, a surfactant, and a dispersant as the need arises. Incidentally, it is preferable that the content of these arbitrary components in the composition for a thick oxide superconducting film of the invention be not more than 10% by weight.

Next, the oxide superconductor in the form of a thick film tape of the invention, which is obtained by the composition for a thick oxide superconducting film of the invention, will be described below along with its production embodiment.

In the production of the oxide superconductor in the form of a thick film tape of the invention, first of all, the foregoing composition for a thick oxide superconducting film of the invention is coated on a substrate.

The foregoing substrate is not particularly limited but can be properly chosen among known substrates which can form a thick oxide superconductive film by the metal organic process. Examples thereof include metallic tapes and metallic tapes provided with an interlayer.

As the foregoing substrate, any of singlecrystalline substrates and polycrystalline substrates can be used. Examples of the foregoing singlecrystalline substrates include a $LaAlO_3$ (100) singlecrystalline substrate (LAO singlecrystalline substrate). On the other hand, examples of the polycrystalline substrates include textured Ni substrates and composite substrates using an IBAD (Ion Beam Assisted Deposition) process.

The method of coating the composition for a thick oxide superconducting film of the invention on the foregoing substrate is not particularly limited but can be properly chosen among known coating methods which have hitherto been employed in forming a thick oxide superconducting film by the metal organic process. Examples thereof include a dip-coating process and a brush coating process.

Next, the composition for a thick oxide superconducting film of the invention having been coated on a substrate is subjected to a heat treatment for calcination to obtain an oxide superconducting precursor. Preferred conditions in this heat treatment for calcination will be described below in detail.

In the foregoing heat treatment for calcination, it is possible to increase a heating rate. In this way, it is possible to subject the oxide superconductor in the form of a thick film tape of the invention to film formation at a high speed. The subject heating rate is preferably 2° C./min or more, and especially preferably 3° C./min or more. The upper limit thereof is not particularly limited so far as the film formation is possible but is usually approximately 5° C./min.

Also, in the foregoing heat treatment for calcination, it is possible to increase the product of the traveling speed of the substrate and the temperature gradient. In this way, it is possible to subject the oxide superconductor in the form of a thick film tape of the invention to film formation in a small electric furnace. The product of the traveling speed of the substrate and the temperature gradient is preferably 2° C./min or more, and especially preferably 3° C./min or more. The upper limit thereof is not particularly limited so far as the film formation is possible but is usually approximately 5° C./min.

Also, it is preferable that the foregoing heat treatment for calcination be carried out at a temperature of 250° C. or higher, and especially in the range of from 300 to 500° C. in the atmosphere where the water vapor partial pressure is not more than 2.1% by volume, and especially from 0.1 to 1.0% by volume.

Next, by subjecting the oxide superconducting precursor obtained by undergoing a heat treatment for calcination to a heat treatment for crystallization, there is obtained the oxide superconductor in the form of a thick film tape of the invention in which the thick oxide superconducting film is formed on the substrate. This heat treatment for crystallization may be carried out by the customary manner. For example, it is preferable that the heat treatment for crystallization be carried out at a heat treatment temperature in the range of from 725 to 775° C. in the atmosphere where the water vapor partial pressure is from 2.1 to 20% by volume.

The thus obtained oxide superconductor in the form of a thick film tape of the invention, especially the oxide superconductor in the form of a thick film tape of the invention containing an organic solvent having a boiling point of 80° C. or higher, has a thick oxide superconducting film having a uniform thickness. A difference between the maximum thickness portion and the minimum thickness portion in the foregoing thick oxide superconducting film is preferably not more than 1 μm, and especially preferably not more than 0.5 μm.

Also, by using the organic solvent having a boiling point of 80° C. or higher, the oxide superconductor in the form of a thick film tape of the invention has a uniform thickness, and by subjecting it to the foregoing heat treatment for crystallization, it is possible to control an amount of change in the critical current density at a small level. The amount of change in the critical current density is preferably within the range of ±0.5 $MA/cm^2$.

Also, in the oxide superconductor in the form of a thick film tape of the invention, the thick oxide superconducting film to be formed on the substrate is preferably comprised of $RE_{1+x}Ba_{2-x}Cu_3O_y$.

Examples of applications of the oxide superconductor in the form of a thick film tape of the invention include wires, devices, or electric instruments such as power cables, transformers and fault current limiters.

The invention will be further described below with reference to the Examples, but it should not be construed that the invention is limited thereto.

EXAMPLE 1

(Production of Yttrium Trifluoroacetate Trihydrate)

A one-liter reaction flask was charged with 75 g of water and 132 g of trifluoroacetic acid, to which was then added 39.66 g of diyttrium trioxide while stirring. After completion of the generation of heat, the mixture was refluxed for 2 hours, and 10 g of methanol was then added to a solution obtained by filtering off insoluble matters. The temperature was raised to 70° C., and the system was gradually evacuated, whereby the reaction mixture was concentrated and evaporated to dryness. After the evaporation to dryness, the system was returned to atmospheric pressure while introducing nitrogen, and the resulting solid was taken out under a nitrogen gas stream to obtain 315 g (percent yield: 92.9%) of a crystal. The obtained crystal was subjected to IR analysis, yttrium content analysis (thermally decomposed at 500° C. and weighed as a trifluoride), and differential thermal analysis in air. As a result of these analyses, the resulting crystal was identified to be yttrium trifluoroacetate trihydrate as a desired product. The analysis results are shown below.

<Analysis Results>

IR analysis: Absorption peaks ($cm^{-1}$)

3664, 3424, 1716, 1666, 1625, 1484, 1467, 1457, 1218, 1151, 865, 842, 800, 759, 732, 678

Yttrium content analysis: 18.5% by weight (theoretical value:

18.45% by weight)

Differential thermal analysis: (at 30° C., 10° C./min, 600° C.)

30° C. (−0.0%: trihydrate), 117° C. (−7.5%: monohydrate), 155° C. (−11.4%: anhydride), 310° C. (−73.2%: yttrium trifluoride)

(Production of Barium Trifluoroacetate Monohydrate)

A one-liter reaction flask was charged with 260 g of water and 315 g of barium hydroxide octahydrate, to which was then dropped 240 g of trifluoroacetic acid at not higher than 40° C. while stirring. After reacting at 25° C. for 2 hours, 20 g of methanol was added to a solution obtained by filtering off insoluble matters. The temperature was raised to 70° C., and the system was gradually evacuated, whereby the reaction mixture was concentrated and evaporated to dryness. After the evaporation to dryness, the system was returned to atmospheric pressure while introducing nitrogen, and the resulting solid was taken out under a nitrogen gas stream to obtain 367 g (percent yield: 96.2%) of a crystal. The obtained crystal was subjected to IR analysis, barium content analysis (sulfuric acid hydrothermal decomposition method), and composition analysis of a residue after heating at 400° C. in air (X-ray analysis). As a result of these analyses, the resulting crystal was identified to be barium trifluoroacetate monohydrate as a desired product. The analysis results are shown below.

<Analysis Results>

IR analysis: Absorption peaks ($cm^{-1}$)

3667, 3432, 1673, 1454, 1213, 1145, 850, 802, 759, 727, 678

Barium content analysis: 36.3% by weight (theoretical value:

36.01% by weight)

Composition analysis after heating at 400° C.: $BaF_2$ (Production of Copper Neodecanoate)

A three-liter reaction flask was charged with 293 g of copper hydroxide and 938 g of isopropanol, to which was then added 1,137 g of neodecanoic acid while stirring. After heating for reflux for 2 hours, the system was gradually evacuated to distill off the isopropanol and water. 1,294 g of toluene was added to that solution, and insoluble matters were filtered off. The resulting solution was again gradually evacuated to distill off the toluene and water, followed by concentration to obtain a viscous liquid. After the concentration, the system was returned to atmospheric pressure while introducing nitrogen, and the resulting viscous liquid was taken out under a nitrogen gas stream to obtain 1,028 g (percent yield: 85.2%) of a liquid. The obtained liquid was subjected to IR analysis, copper content analysis (thermally decomposed at 800° C. and weighed as copper oxide), and composition analysis of a residue after heating (X-ray analysis). As a result of these analyses, the resulting liquid was identified to be copper neodecanoate as a desired product. The analysis results are shown below.

<Analysis Results>

IR analysis: Absorption peaks ($cm^{-1}$)

3617, 3448, 3153, 2964, 2873, 1697, 1600, 1535, 1465, 1411, 1376, 1299, 1234, 1174, 1004, 786, 653, 484

Copper content analysis: 15.35% by weight (theoretical value:

15.66% by weight)

Composition analysis after heating at 800° C.: CuO (Preparation of Composition for Thick Oxide Superconducting Film)

1.7 g of the obtained yttrium trifluoroacetate trihydrate, 2.9 g of the obtained barium trifluoroacetate monohydrate, and 4.9 g of the obtained copper neodecanoate (in terms of a metal atom molar ratio of Y/Ba/Cu of 1/2/3.05) were mixed, to which was then added and stirred 9.2 g of 2-octanone (at 28° C.). As a result, the mixture was uniformly dissolved. This precursor solution was designated as a composition 1.

(Film Formation of Oxide Superconductor in Form of Thick Film Tape)

An IBAD composite substrate comprising Hastelloy, $Gd_2Zr_2O_7$ and $CeO_2$ was used as a substrate. This IBAD composite substrate was prepared by film formation of a first interlayer of $Gd_2Zr_2O_7$ in a thickness of 1 μm on a Hastelloy tape having a length of 10 m, a width of 10 mm and a thickness of 0.1 mm at room temperature using the IBAD process and film formation of a second interlayer of $CeO_2$ in a thickness of 0.5 μm thereon using a sputtering process.

After coating the foregoing composition 1 on this IBAD composite substrate by a dip coating process, the coated substrate was calcined to 500° C. at a heating rate of 0.2 to 5° C./min (see Tables 1 to 3) in the atmosphere having a water vapor partial pressure of 2.1% by volume and an oxygen partial pressure of 97.9% by volume and then subjected to furnace cooling in the atmosphere having an oxygen partial pressure of 100%. Subsequently, the coating and calcination were repeated in the same manner (with respect to the number of times, see Tables 1 to 3), thereby obtaining Y—Ba—Cu precursors. Thereafter, each of the subject precursors was heated at a heating rate of 25° C./min in the atmosphere having a water vapor partial pressure of 6.3% by volume and an oxygen partial pressure of 93.7% by volume and baked at a substrate temperature of 750° C. for 1 to 3 hours. Thereafter, the atmosphere within the furnace was switched into a dry gas, and the baked precursor was kept for 10 minutes, followed by furnace cooling to obtain an oxide superconductor in the form of a thick film tape. The thickness resulting from one-time coating was 0.3 μm.

Silver was subjected to vapor deposition on the thick oxide superconducting film on the resulting oxide superconductor in the form of a thick film tape to form an electrode, which was then thermally treated in the oxygen atmosphere at 450° C. for one hour.

A 10 cm-long sample was prepared from each of the oxide superconductors in the form of a thick film tape (Examples 1-1 and 1-2) obtained at a heating rate in the calcination of 0.2° C./min and at the number of times of coating and calcination of 1 or 3 and then measured for $J_c$ and $I_c$ (critical current) in liquid nitrogen. The measurement results are shown in Table 1.

A 10 cm-long sample was prepared from the oxide superconductor in the form of a thick film tape (Example 1-3) obtained at a heating rate in the calcination of 5° C./min and at the number of times of coating and calcination of 3 and then measured for $J_c$ and $I_c$ in liquid nitrogen. The measurement results are shown in Table 2 along with the measurement results of the oxide superconductor in the form of a thick film tape obtained in Example 1-2.

Further, with respect to the oxide superconductor in the form of a thick film tape obtained in Example 1-2 (10 cm-long sample), the maximum thickness and minimum thickness and the maximum $I_c$ and minimum $I_c$ were measured, thereby examining the uniformity in the longitudinal direction. The measurement results are shown in Table 3.

Comparative Example

TFA salts of respective metals were dissolved in methanol such that the molar ratio of Y/Ba/Cu became 1/2/3.05, and the concentration of the solution was adjusted at 0.25 moles/liter as reduced into Y, thereby preparing a comparative composition. Oxide superconductors (Comparative Examples 1-1 to 1-3) were prepared in the same manners as in Examples 1-1 to 1-3, except for using the subject comparative composition as the starting material solution in place of the composition 1, and then measured for various characteristics. The measurement results are shown in Tables 1 to 3.

TABLE 1

|  | Example 1-1 | Example 1-2 | Comparative Example 1-1 | Comparative Example 1-2 |
|---|---|---|---|---|
| Thickness (μm) | 0.3 | 0.9 | 0.3 | 0.9 |
| Number of times of coating | 1 | 3 | 1 | 3 |
| Heating rate (° C./min) | 0.2 | 0.2 | 0.2 | 0.2 |
| $J_c$ (MA/cm$^2$) | 5.2 | 3.5 | 5.3 | 3.7 |
| $I_c$ (A) | 156 | 315 | 159 | 333 |

TABLE 2

|  | Example 1-2 | Example 1-3 | Comparative Example 1-2 | Comparative Example 1-3 |
|---|---|---|---|---|
| Thickness (μm) | 0.9 | 0.9 | 0.9 | 0.9 |
| Number of times of coating | 3 | 3 | 3 | 3 |
| Heating rate (° C./min) | 0.2 | 5 | 0.2 | 5 |
| $J_c$ (MA/cm$^2$) | 3.5 | 3.6 | 3.7 | 0.2 |
| $I_c$ (A) | 315 | 324 | 333 | 18 |

TABLE 3

|  | Example 1-2 | Comparative Example 1-2 |
|---|---|---|
| Number of times of coating | 3 | 3 |
| Minimum thickness (μm) | 0.81 | 0.83 |
| Maximum thickness (μm) | 0.99 | 2.0 |
| Minimum $I_c$ (A) | 280 | 25 |
| Maximum $I_c$ (A) | 347 | 333 |

As is evident from the results shown in Table 1, in the oxide superconductors in the form of a thick film tape of the invention (Examples 1-1 and 1-2) as prepared using the composition for a thick oxide superconducting film of the invention, characteristics substantially the same as those in the oxide superconductors in the form of a thick film tape (Comparative Examples 1-1 and 1-2) as prepared using the conventional composition for a thick oxide superconducting film were obtained. However, the composition for a thick oxide superconducting film of the invention (composition 1) could be uniformly coated on the substrate without causing vaporization of the solvent during the coating step, whereas the conventional composition for a thick oxide superconducting film (comparative composition) could not be uniformly coated while causing volatilization of the methanol during the coating step.

Also, as is evident from the results shown in Table 2, in the oxide superconductor in the form of a thick film tape of the invention (Example 1-3), even in the case of the preparation of a fast heating rate, $J_c$ and $I_c$ were not lowered, and the calcination could be achieved within a short period of time. In contrast, in the oxide superconductor in the form of a thick film tape as prepared at a fast heating rate using the conventional composition for a thick oxide superconducting film (Comparative Example 1-3), $J_c$ and $I_c$ were remarkably lowered.

Moreover, it was confirmed from the results shown in Table 3 that in the oxide superconductor in the form of a thick film tape of the invention (Example 1-2), scatters of the thickness and $I_c$ values were within ±10%. In contrast, in the oxide superconductor in the form of a thick film tape as prepared using the conventional composition for a thick oxide superconducting film (Comparative Example 1-2), concentration of the starting material solution was noted due to volatilization of the methanol in the starting material solution during the coating step. For that reason, a scatter of the thickness of the oxide superconductor in the form of a thick film tape was large as a wire, and in the thick portion, cracking was generated during the calcination step, and a lowering of $J_c$ was largely observed.

In the light of the above, it was noted that the composition for a thick oxide superconducting film of the invention using a high boiling solvent is free from a change of the concentration with time, from which a uniform wire can be prepared at a high speed.

EXAMPLE 2

(Production of Copper 2-ethylhexanoate)

A two-liter reaction flask was charged with 112 g of copper hydroxide and 688 g of ethanol, to which was then added 341 g of 2-ethylhexanoic acid while stirring. After heating for reflux at 80° C. for 4 hours, 120 g of water was added, and the mixture was heated for reflux for an additional one hour. After the reflux, the system was gradually evacuated to distill off the ethanol and water, thereby obtaining a solid. 400 g of ethanol was added to the obtained solid, and insoluble matters were filtered off. The resulting solution was again gradually evacuated, whereby the reaction mixture was concentrated and evaporated to dryness. After the evaporation to dryness, the system was returned to atmospheric pressure while introducing nitrogen, and the resulting solid was taken out under a nitrogen gas stream to obtain 302 g (percent yield: 75.1%) of a crystal. The obtained crystal was subjected to IR analysis, copper content analysis (thermally decomposed at 800° C. and weighed as copper oxide), and composition analysis of a residue after heating (X-ray analysis). As a result of these analyses, the resulting crystal was identified to be copper 2-ethylhexanoate as a desired product. The analysis results are shown below.

<Analysis Results>
IR analysis: Absorption peaks (cm$^{-1}$)
3446, 2958, 2935, 2873, 1594, 1517, 1457, 1421, 1378, 1322, 1236, 1106, 808, 761, 732, 692, 601, 457
Copper content analysis: 18.27% by weight (theoretical value: 18.16% by weight)
Composition analysis after heating at 800° C.: CuO (Preparation of Composition for Thick Oxide Superconducting Film and Film Formation of Oxide Superconductor in Form of Thick Film Tape)

A precursor solution (composition 2) was obtained in the same manner as in Example 1, except for using 6.7 g of the obtained copper 2-ethylhexanoate in place of 4.9 g of the copper neodecanoate.

An oxide superconductor in the form of a thick film tape was prepared in the same manner as in Example 1, except for using the foregoing composition 2 in place of the composition 1, and then measured for various characteristics. As a result, there were obtained good results the same as in Example 1.

EXAMPLE 3

(Production of Copper Isononanoate)

A 300-mL reaction flask was charged with 15 g of copper hydroxide, 100 g of water, and 80 g of isopropanol, to which was then added 50 g of isononanoic acid while stirring. After stirring at 50° C. for one hour, the system was gradually evacuated to distill off the isopropanol and water. 43 g of toluene was added to that solution, and the resulting solution was again gradually evacuated to distill off the toluene and water, followed by concentration to obtain a solid. 130 g of toluene was again added to the resulting solid, and a solution obtained by filtering off insoluble matters was again gradually evacuated, whereby the reaction mixture was concentrated and evaporated to dryness. After the evaporation to dryness, the system was returned to atmospheric pressure while introducing nitrogen, and the resulting solid was taken out under a nitrogen gas stream to obtain 44 g (percent yield: 77.6%) of a crystal. The obtained crystal was subjected to IR analysis, copper content analysis (thermally decomposed at 800° C. and weighed as copper oxide), and composition analysis of a residue after heating (X-ray analysis). As a result of these analyses, the resulting crystal was identified to be copper isononanoate as a desired product. The analysis results are shown below.

<Analysis Results>

IR analysis: Absorption peaks ($cm^{-1}$)

3438, 2956, 2902, 2869, 1581, 1508, 1417, 1365, 1319, 1247, 759, 678, 667

Copper content analysis: 15.92% by weight (theoretical value: 16.81% by weight)

Composition analysis after heating at 800° C.: CuO (Preparation of Composition for Thick Oxide Superconducting Film and Film Formation of Oxide Superconductor in Form of Thick Film Tape)

A precursor solution (composition 3) was obtained in the same manner as in Example 1, except for using 8.0 g of the obtained copper isononanoate in place of 4.9 g of the copper neodecanoate.

An oxide superconductor in the form of a thick film tape was prepared in the same manner as in Example 1, except for using the foregoing composition 3 in place of the composition 1, and then measured for various characteristics. As a result, there were obtained good results the same as in Example 1.

EXAMPLE 4

(Production of Copper Naphthenate)

A three-liter reaction flask was charged with 195 g of copper hydroxide and 625 g of isopropanol, to which was then added 981 g of naphthenic acid while stirring. After heating for reflux for 2 hours, the system was gradually evacuated to distill off the isopropanol and water. 860 g of toluene was added to that solution, and insoluble matters were filtered off. The resulting solution was again gradually evacuated to distill off the toluene and water, followed by concentration to obtain a viscous liquid. After the concentration, the system was returned to atmospheric pressure while introducing nitrogen, and the resulting viscous liquid was taken out under a nitrogen gas stream to obtain 884 g (percent yield: 83.6%) of a liquid. The obtained liquid was subjected to IR analysis, copper content analysis (thermally decomposed at 800° C. and weighed as copper oxide), and composition analysis of a residue after heating (X-ray analysis). As a result of these analyses, the resulting crystal was identified to be copper naphthenate as a desired product. The analysis results are shown below.

<Analysis Results>

IR analysis: Absorption peaks ($cm^{-1}$)

3436, 2925, 2867, 1704, 1589, 1540, 1456, 1417, 1376, 1305, 734, 686

Copper content analysis: 7.8% by weight

Composition analysis after heating at 800° C.: CuO (Preparation of Composition for Thick Oxide Superconducting Film and Film Formation of Oxide Superconductor in Form of Thick Film Tape)

A precursor solution (composition 4) was obtained in the same manner as in Example 1, except for using 9.9 g of the obtained copper naphthenate in place of 4.9 g of the copper neodecanoate.

An oxide superconductor in the form of a thick film tape was prepared in the same manner as in Example 1, except for using the foregoing composition 4 in place of the composition 1, and then measured for various characteristics. As a result, there were obtained good results the same as in Example 1.

INDUSTRIAL APPLICABILITY

According to the invention, it is possible to provide a composition for a thick oxide superconducting film capable of being subjected to film formation with uniformity at a high speed, which is suitable for producing thick copper based oxide superconducting films by the MOD process, and an oxide superconductor in the form of a thick film tape using the subject composition for a thick oxide superconducting film.

The invention claimed is:

1. A composition for a thick oxide superconducting film, containing a copper salt of a branched saturated aliphatic carboxylic acid having 6 or more carbon atoms or a copper salt of an alicyclic carboxylic acid having 6 or more carbon atoms, and further containing yttrium trifluoroacetate and barium trifluoroacetate.

2. The composition for a thick oxide superconducting film according to claim 1, wherein the copper salt of a branched saturated aliphatic carboxylic acid having 6 or more carbon atoms or the copper salt of an alicyclic carboxylic acid having 6 or more carbon atoms is at least one kind selected from the group consisting of copper neodecanoate, copper isononanoate, copper 2-ethylhexanoate, and copper naphthenate.

3. The composition for a thick oxide superconducting film according to claim 2, containing an organic solvent having a boiling point of 80° C. or higher as a solvent.

4. The composition for a thick oxide superconducting film according to claim 3, which is characterized in that the foregoing organic solvent is 2-octanone.

5. A composition for a thick oxide superconducting film, containing a copper salt of a branched saturated aliphatic carboxylic acid having 6 or more carbon atoms or a copper salt of an alicyclic carboxylic acid having 6 or more carbon atoms, and containing an yttrium salt of a branched saturated aliphatic carboxylic acid having 6 or more carbon atoms or an yttrium salt of an alicyclic carboxylic acid having 6 or more carbon atoms, and further containing barium trifluoroacetate.

6. The composition for a thick oxide superconducting film according to claim 5, wherein the copper salt of a branched saturated aliphatic carboxylic acid having 6 or more carbon atoms or the copper salt of an alicyclic carboxylic acid having 6 or more carbon atoms is at least one kind selected from the group consisting of copper neodecanoate, copper isononanoate, copper 2-ethylhexanoate, and copper naphthenate.

7. The composition for a thick oxide superconducting film according to claim 6, containing an organic solvent having a boiling point of 80° C. or higher as a solvent.

8. The composition for a thick oxide superconducting film according to claim 7, which is characterized in that the foregoing organic solvent is 2-octanone.

9. A method of producing an oxide superconductor in the form of a thick film tape comprising the steps of:
coating a composition for a thick oxide superconducting film, containing a copper salt of a branched saturated aliphatic carboxylic acid having 6 or more carbon atoms or a copper salt of an alicyclic carboxylic acid having 6 or more carbon atoms, and further containing yttrium trifluoroacetate and barium trifluoroacetate, on a substrate,
subjecting an oxide superconducting precursor, which is obtained by a heat treatment for calcination, to a heat treatment for crystallization, and
forming a thick oxide superconductor film on said substrate.

10. The method of producing the oxide superconductor in the form of a thick film tape according to claim 9, wherein in said heat treatment for calcination, a heating rate is 20° C./min or more.

11. The method of producing the oxide superconductor in the form of a thick film tape according to claim 9, wherein in said heat treatment for calcination, the product of the traveling speed of the substrate and the temperature gradient is preferably 20° C./min or more.

12. The method of producing the oxide superconductor in the form of a thick film tape according to claim 9, wherein said heat treatment for calcination is carried out at 250° C. or higher in the atmosphere having a water vapor partial pressure of not more than 2.1% by volume.

13. The method of producing the oxide superconductor in the form of a thick film tape according to claim 9, wherein a difference between the maximum thickness portion and the minimum thickness portion in said thick oxide superconducting film is 1 μm or less.

14. The method of producing the oxide superconductor in the form of a thick film tape according to claim 9, wherein the amount of change in critical current density is ±0.5 MA/cm$^2$.

15. The method of producing the oxide superconductor in the form of a thick film tape according to claim 9, wherein said thick oxide superconducting film is comprised of $RE_{1+x}Ba_{2-x}Cu_3O_y$ (wherein RE represents at least one element selected from the group consisting of Y, Nd, Sm, Gd, Eu, Yb, Pr and Ho; x represents the number of $0 \leq x \leq 0.4$; and y represents the number of $6.5 \leq y \leq 7.0$).

16. A method of producing an oxide superconductor in the form of a thick film tape comprising the steps of:
coating a composition for a thick oxide superconducting film, containing a copper salt of a branched saturated aliphatic carboxylic acid having 6 or more carbon atoms or a copper salt of an alicyclic carboxylic acid having 6 or more carbon atoms, and containing an yttrium salt of a branched saturated aliphatic carboxylic acid having 6 or more carbon atoms or an yttrium salt of an alicyclic carboxylic acid having 6 or more carbon atoms, and further containing barium trifluoroacetate, on a substrate,
subjecting an oxide superconducting precursor, which is obtained by a heat treatment for calcination, to a heat treatment for crystallization, and
forming a thick oxide superconductor film on said substrate.

17. The method of producing the oxide superconductor in the form of a thick film tape according to claim 16, wherein in said heat treatment for calcination, a heating rate is 2° C./min or more.

18. The method of producing the oxide superconductor in the form of a thick film tape according to claim 16, wherein in said heat treatment for calcination, the product of the traveling speed of the substrate and the temperature gradient is preferably 2° C./min or more.

19. The method of producing the oxide superconductor in the form of a thick film tape according to claim 16, wherein said heat treatment for calcination is carried out at 250° C. or higher in the atmosphere having a water vapor partial pressure of not more than 2.1% by volume.

20. The method of producing the oxide superconductor in the form of a thick film tape according to claim 16, wherein a difference between the maximum thickness portion and the minimum thickness portion in said thick oxide superconducting film is 1 μm or less.

21. The method of producing the oxide superconductor in the form of a thick film tape according to claim 16, wherein the amount of change in critical current density is ±0.5 MA/cm$^2$.

22. The method of producing the oxide superconductor in the form of a thick film tape according to claim 16, wherein said thick oxide superconducting film is comprised of $RE_{1+x}Ba_{2-x}Cu_3O_y$ (wherein RE represents at least one element selected from the group consisting of Y, Nd, Sm, Gd, Eu, Yb, Pr and Ho; x represents the number of $0 \leq x \leq 0.4$; and y represents the number of $6.5 \leq y \leq 7.0$).

* * * * *

UNITED STATES PATENT AND TRADEMARK OFFICE
CERTIFICATE OF CORRECTION

| | |
|---|---|
| PATENT NO. | : 7,307,046 B2 |
| APPLICATION NO. | : 10/531172 |
| DATED | : December 11, 2007 |
| INVENTOR(S) | : Honjo Tetsuji et al. |

It is certified that error appears in the above-identified patent and that said Letters Patent is hereby corrected as shown below:

Column 13, line 34 (claim 10, line 3), "20° C./min" should read -- 2° C./min --; and Column 13, line 40 (claim 11, line 5), "20° C./min" should read -- 2° C./min --.

Signed and Sealed this

Seventeenth Day of June, 2008

JON W. DUDAS
*Director of the United States Patent and Trademark Office*